United States Patent
Shearman et al.

(10) Patent No.: US 7,145,773 B2
(45) Date of Patent: Dec. 5, 2006

(54) PLUGGABLE ELECTRONIC MODULE

(75) Inventors: Simon Shearman, Almonte (CA); John Atkinson, Ottawa (CA); Jon Bulman-Fleming, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 32 days.

(21) Appl. No.: 10/787,601

(22) Filed: Feb. 26, 2004

(65) Prior Publication Data

US 2005/0190540 A1    Sep. 1, 2005

(51) Int. Cl.
    *H05K 7/20*    (2006.01)
(52) U.S. Cl. .............. 361/715; 361/800; 385/92; 385/93; 439/385; 439/437
(58) Field of Classification Search .......... 361/715, 361/800, 683–686; 385/92–93; 174/260, 174/255; 439/281–282, 437, 385
    See application file for complete search history.

(56) References Cited

U.S. PATENT DOCUMENTS 6,071,016 A * 6/2000 Ichino et al. ............. 385/92
6,508,595 B1 * 1/2003 Chan et al. ............... 385/92
2004/0027816 A1 * 2/2004 Ice ............................ 361/797

OTHER PUBLICATIONS

Ghiasi, Ali; XFP Multi-Source Agreement (10 Gigabit Small Form Factor Pluggable Module); Apr. 2, 2003; 175 pp; Revision 3.1.
DWDM Pluggable Transceiver Multi-Source Agreement; Public Document Release 3; Mar. 30, 2003; 56 pp.

* cited by examiner

*Primary Examiner*—Randy W. Gibson
*Assistant Examiner*—Hung S. Bui
(74) *Attorney, Agent, or Firm*—Guerin & Rodriguez, LLP

(57) ABSTRACT

A pluggable electronic module is provided that has an electronic component and a module body enclosing the electronic component. The module body has a first surface and a second surface. The first surface has a first area substantially parallel to the second surface and a second area that defines a non-zero angle with respect to the first area. The second area contacts a thermal sink to dissipate heat generated by the electronic component. The pluggable electronic module has a reduced insertion force in comparison with conventional pluggable electronic modules.

11 Claims, 8 Drawing Sheets

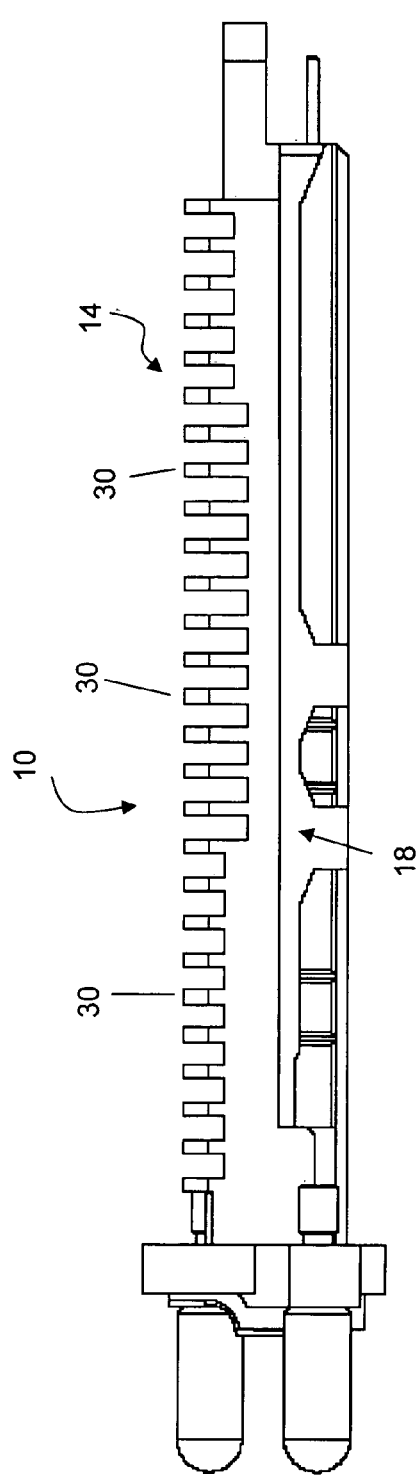
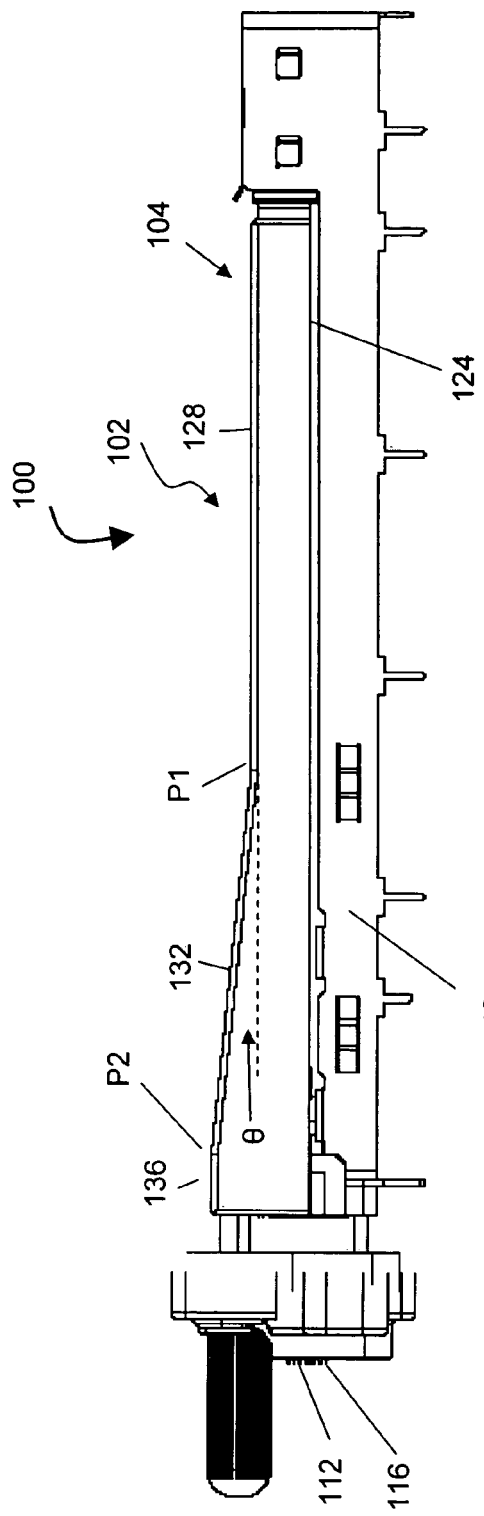
FIG. 1B (PRIOR ART)
FIG. 2B

PLUGGABLE ELECTRONIC MODULE

FIELD OF THE INVENTION

The invention relates to electronic modules and more specifically to pluggable electronic modules.

BACKGROUND OF THE INVENTION

Electronic component manufacturers often work together to develop a multi-source agreement (MSA) that describes guidelines for manufacturing an electronic module. For example, there exists an MSA for dense wavelength division multiplexing (DWDM) pluggable transceiver modules and for XFP (10 gigabit small form factor pluggable module) devices. With reference to FIGS. 1A and 1B, a pluggable transceiver module 10 constructed for DWDM communications includes a top module body 14, bottom module body 18, a transmit port 22, a receive port 26, and a plurality of heat transfer fins 30. Electronic components (not shown), which are concealed by top module body 14 and bottom module body 18 can include optical transmitters, optical receivers, and various electronic circuits and devices, which provide the functionality of the pluggable transceiver module 10. The transmit port 22 and the receive port 26 facilitate optical communication between the module 10 and other modules or components of a communications system. The ports 22, 26 are coupled through optical communication paths to the electronic components within the bottom module body 18. During operation, the electronic components within bottom module body 18 generate heat, which is removed through top module body 14 to permit normal operation of the transceiver module 10. The heat transfer fins 30 extend from the top module body 14 and help to dissipate the heat generated by the electronic components within bottom module body 18. In other transceiver modules (not shown), the heat transfer fins 30 are not present. Instead, the top module body 14 is relatively flat in the region where the heat transfer fins 30 are typically located.

In some communications applications, multiple pluggable modules 10 are grouped together in an enclosure. The enclosure typically includes printed circuit boards (PCBs), circuitry, and other devices, which are part of an optical communications system. The top surface of the enclosure often is a heat sink. As the modules 10 are inserted into the enclosure, the heat transfer fins 30 make contact with the underside of the heat sink to establish a thermal path to dissipate the heat generated by the electronic components within the bottom module body 18. The friction between the heat transfer fins 30 and the underside of the heat sink during insertion is undesirable because it increases the force necessary to insert and remove the pluggable modules 10.

What is needed is a pluggable electronic module that has reduced friction during insertion and provides enhanced heat dissipation.

SUMMARY OF THE INVENTION

One object of the present invention is to provide a pluggable electronics module that interfaces with a fixed heat sink. Another object of the invention is to provide a pluggable electronics module that requires a reduced insertion force. Yet another object of the invention is to provide a pluggable electronics module that provides thermal transfer capabilities without stressing a printed circuit board (PCB) interconnect system.

In one aspect, the invention relates to a pluggable electronic module having an electronic component and a module body enclosing the electronic component. The module body has a first surface and a second surface. The first surface has a first area substantially parallel to the second surface and a second area that defines a non-zero angle with respect to the first area. The second area contacts a thermal sink to dissipate heat generated by the electronic component.

In another aspect, the invention relates to a pluggable electronic module having an electronic component and a means for dissipating heat generated by the electronic component. The means for dissipating heat substantially encloses the electronic component and has a first surface and a second surface. The first surface has a first area substantially parallel to the second surface and a second area that defines a non-zero angle with respect to the first area. The second area contacts a thermal sink.

In yet another aspect, the invention relates to a method of cooling an electronic module. The method includes receiving the electronic module in an opening of a thermal sink. The electronic module has a module body that encloses the electronic component. The module body has a first surface and a second surface. The first surface has a first area substantially parallel to the second surface and a second area that defines a non-zero angle with respect to the first area. The method also includes providing a thermal path between the second area and the thermal sink, and dissipating heat generated by the electronic component through the thermal path.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 1B is a side view of the module of FIG. 1A.

FIG. 2B is a side view of the module and PCB mount rail of FIG. 2A.

DETAILED DESCRIPTION

Figure 1A:
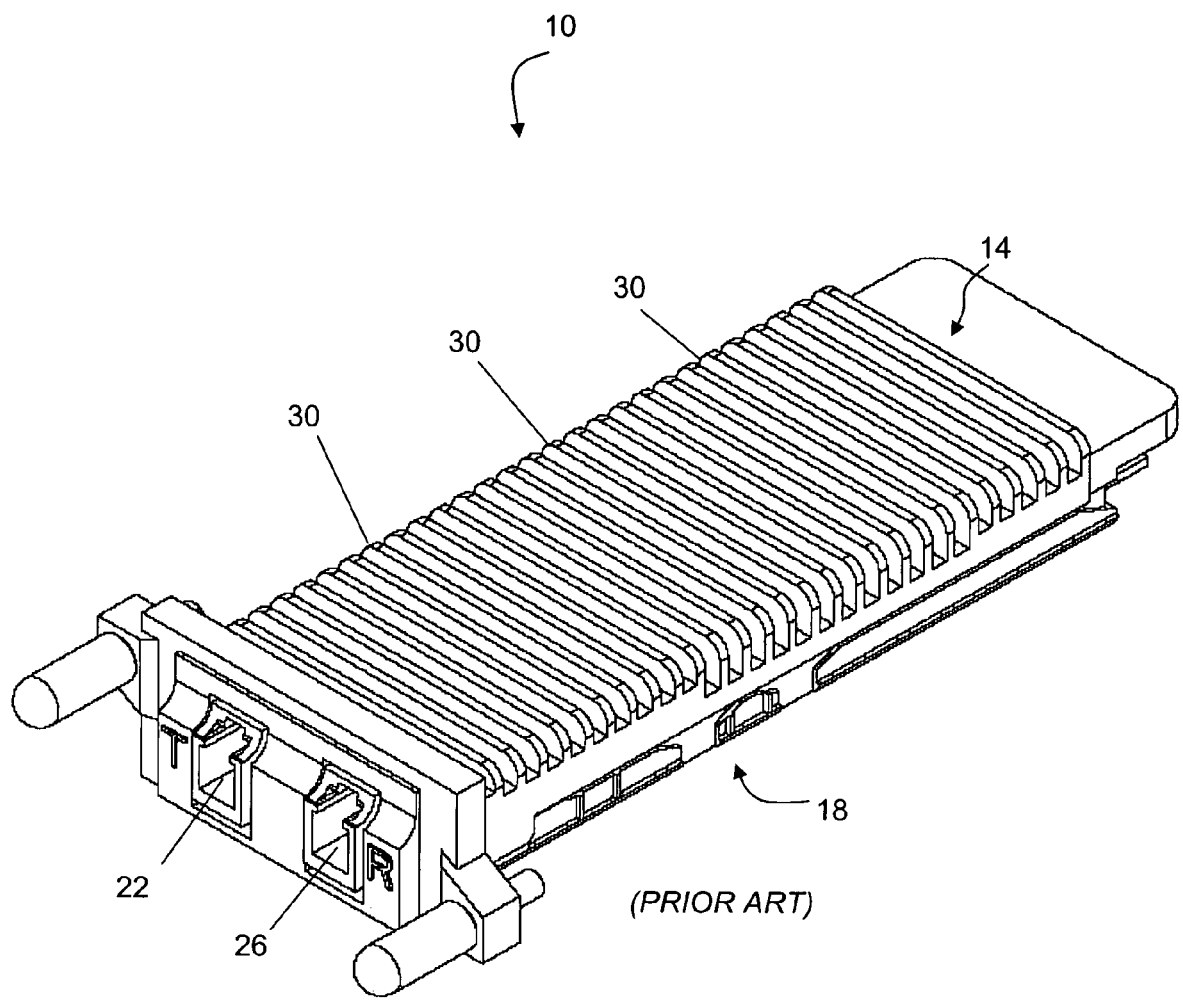
FIG. 1A is an isometric view of one embodiment of a prior art pluggable electronic module.
Figure 2A:
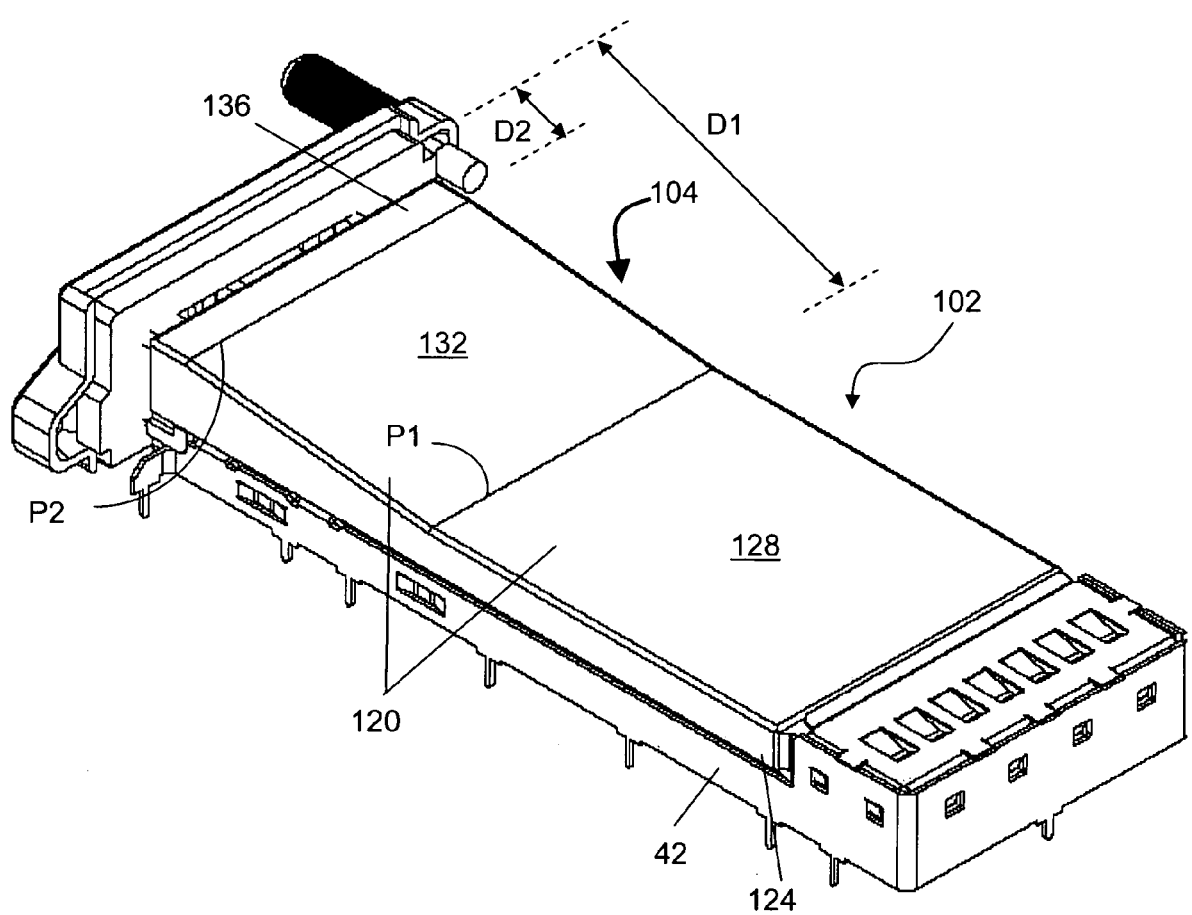
FIG. 2A is an isometric view of an embodiment of a pluggable electronic module mounted to a PCB mount rail constructed according to the principles of the invention.

With reference to FIGS. 2A and 2B, an embodiment of a pluggable electronic module 100 constructed according to the principles of the invention includes a module body assembly 102 having a top module body 104 and a bottom module body (not shown), electronic components (not shown), a transmit port 112, and a receive port 116. The top module body 104 is parallel and sealed to the bottom body with an internal electromagnetic compliant (EMC) gasket that prevents electromagnetic radiation from escaping from the body assembly 102. Electronic components within the module body assembly 102 provide the functionality of the pluggable electronics module 100 and generate heat, which is removed through the top module body 104 during operation to maintain satisfactory module performance.

The top module body 104 includes a first surface 120 (top) and a second surface 124 (bottom). The bottom surface 124 makes contact with the top of the bottom module body to form an EMC seal. The top surface 120 has a first area 128, a second area 132, and a third area 136. The first area 128 is approximately parallel to the bottom surface 124. The second area 132 extends at a non-zero angle θ with respect to the first area 128 towards the front of the pluggable electronics module 100. The first area 128 and the second area 132 meet along a line P1 at a predetermined distance D1 from the front of the module body 104. The distance D1 is dependent upon the angle θ. The third area 136 is also substantially parallel to the bottom surface 124. The second area 132 and the third area 136 meet along a line P2 at a predetermined distance D2 from the front of the module body 104. In one embodiment, the predetermined distance D2 is dependent upon the angle θ. In the illustrated embodiment, the predetermined distance D2 is 9.5 mm. The locations of the first area 128, the second area 132, and the third area 138 are determined according to the location of the electronic components within the module body 104 to achieve a desired heat dissipation characteristic.

The module body assembly 102 can be constructed from a metal, such as aluminum. Alternatively, the module body assembly 102 can be constructed from any material that conforms to predetermined thermal requirements, such as die cast magnesium or zinc. Additionally, the top module body 104 can be constructed of aluminum and the bottom module body can be constructed of aluminum or a metal coated plastic. Constructing the bottom module body of metal coated plastic provides a path for ground currents to travel during operation. The ground currents aid in preventing noise waves from penetrating the module body assembly 102.

Figure 3:
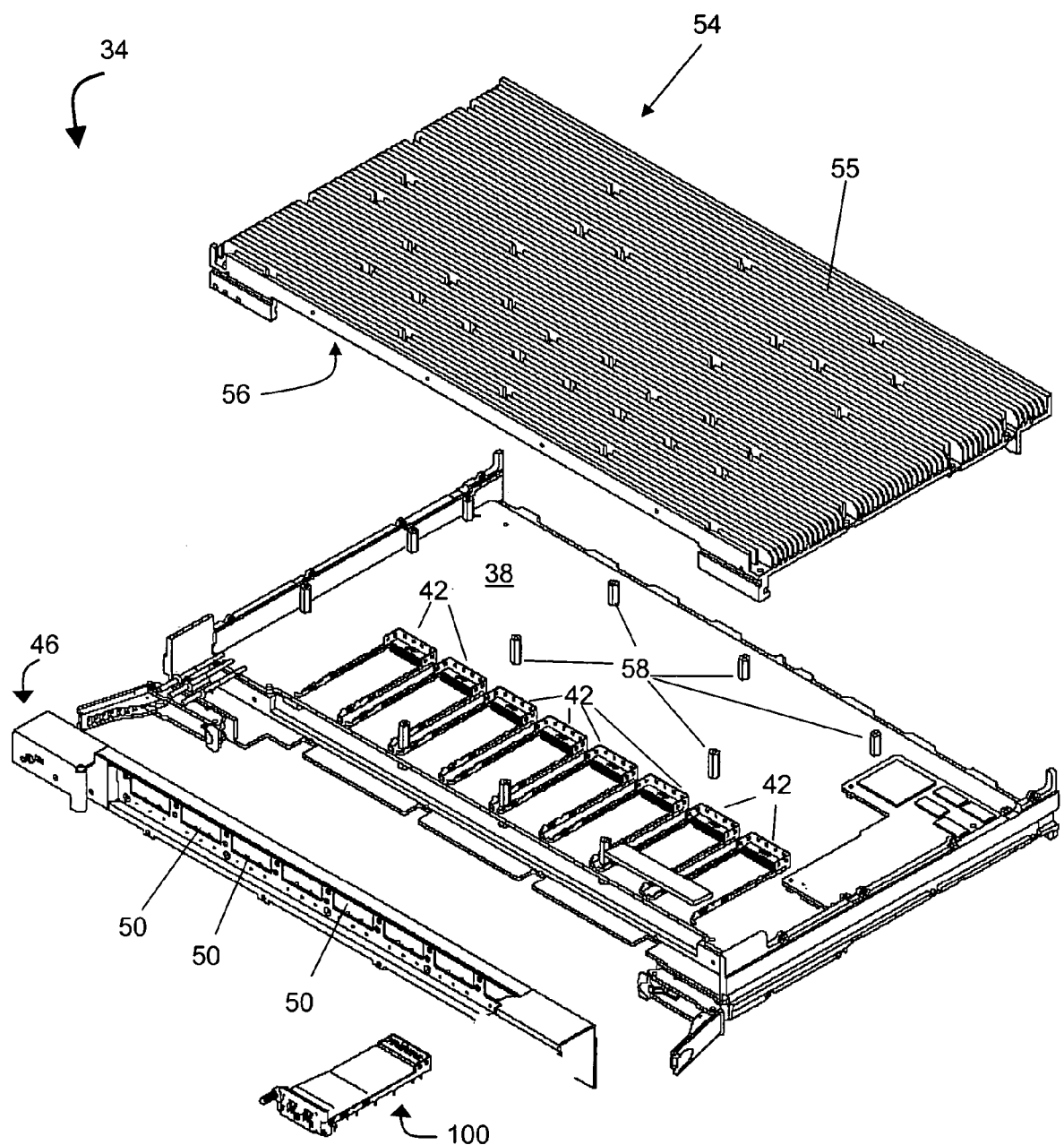
FIG. 3 is an exploded view of a carrier used in a communications system.

In one exemplary configuration, the electronic module 100 is used as part of a carrier 34 as shown in FIG. 3. The carrier 34 includes a PCB 38, a plurality of PCB mount rails 42, an interface panel 46 having a plurality of openings 50 and a heat sink 54 having a topside 55 and an underside 56. The heat sink 54 is attached to the PCB 38 at the various attachment points 58. The heat sink 54 does not move relative to the PCB 38 once it is attached to the PCB 38. Each electronic module 100 is inserted though a respective opening 50 in the interface panel 46. Each of the PCB mount rails 42 receives one of the pluggable electronics modules 100. The rear of the pluggable electronics module 100 engages an electrical connector that electrically couples the electronics module 100 to the PCB 38. As the pluggable electronics module 100 is inserted, the first area 128 of the top surface 120 of the module body 104 does not make contact with the underside 56 of the heat sink 54. The force required to insert the electronic module 100 into the carrier 34 is reduced because there is less friction to overcome. As the second area 132 of the top surface 120 passes through the opening 50, a distance between the second area 132 and the underside 56 of the heat sink 54 decreases according to the angle θ and the increasing insertion length. The minimum separation between the module body 104 and the underside 56 of the heat sink 54 is achieved when the third area 136 of the top surface 120 enters the opening 50.

Once the electronic module 100 is fully inserted, the PCB mount rail 42 assists in maintaining the electronic module 100 in place. However, a gap exists between the second area 132 of the first surface 120 and the underside 56 of the heat sink 54. The gap limits the transfer of heat from the electronic module 100 to the heat sink 54.

It is desirable to provide a thermal path from the module body 104 to the heat sink 54. The thermal path increases heat transfer and improves the performance of the electronic module 100. To provide a thermal path, a thermally conductive member is placed between the second area 132 of the top surface 120 and the underside 56 of the heat sink 54.

Figure 4A:
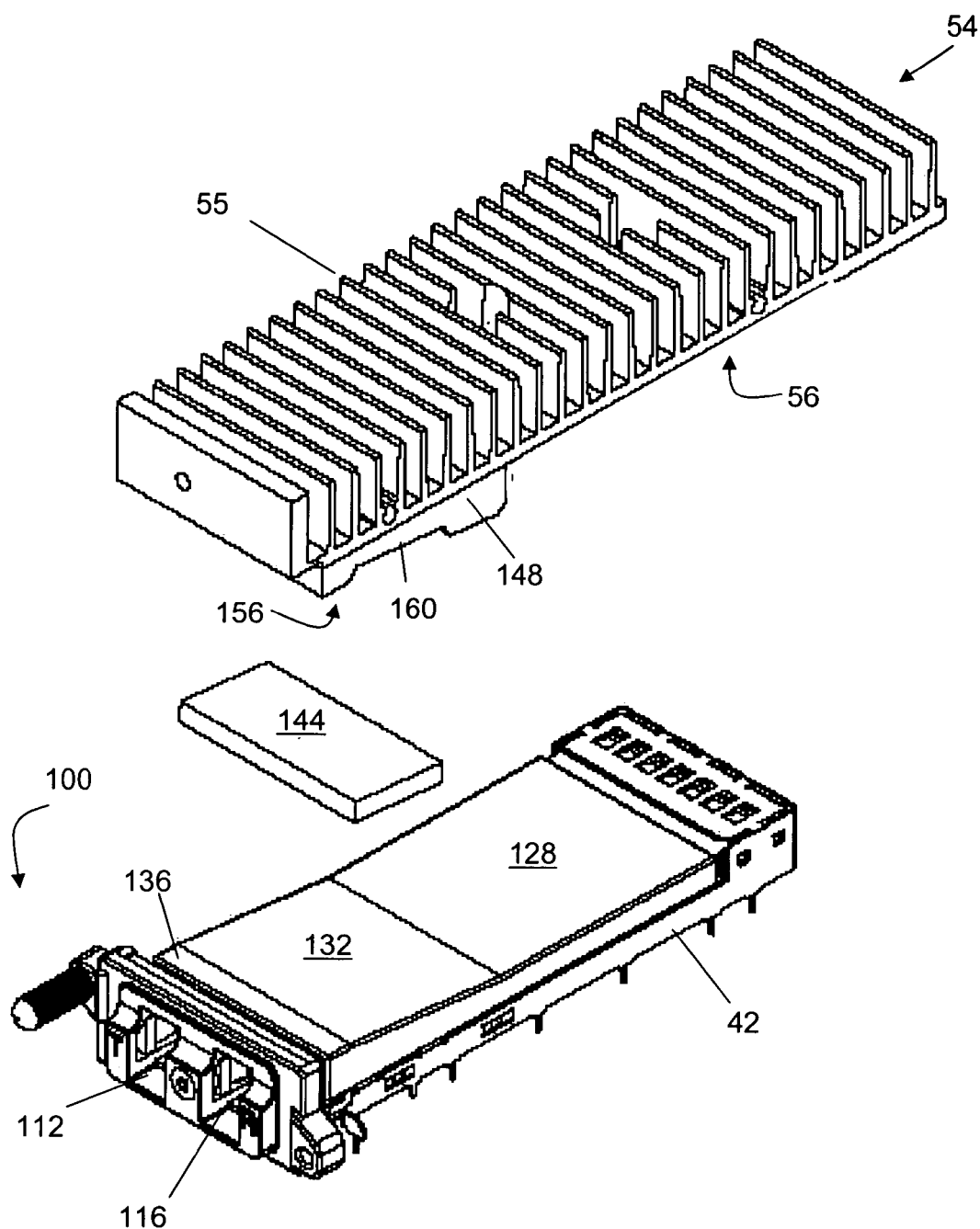
FIG. 4A is an exploded view of another embodiment of a pluggable electronic module and a portion of the carrier of FIG. 3.
Figure 4B:
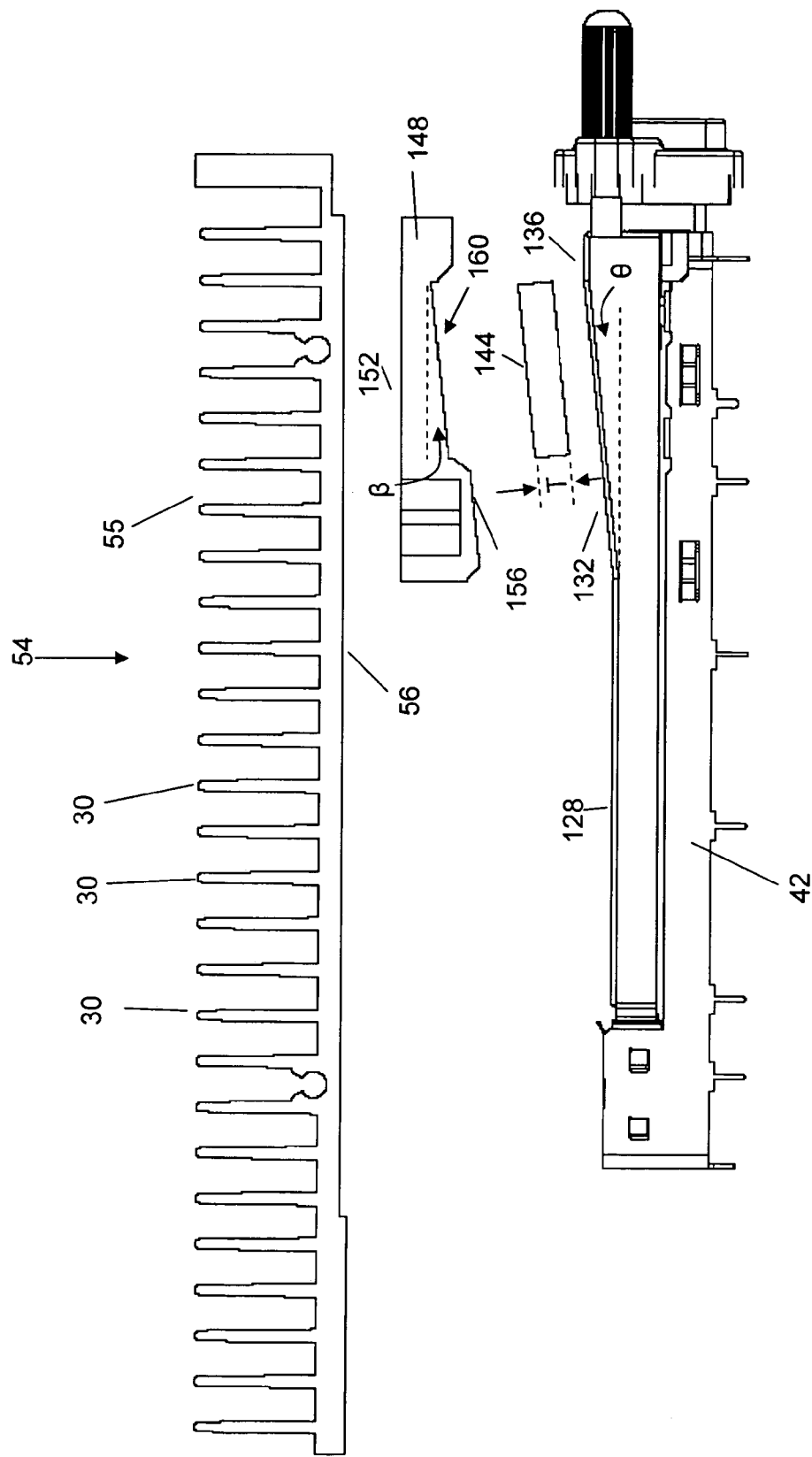
FIG. 4B is a side view of the pluggable electronic module and carrier of FIG. 4A.

An exploded view of a portion of the heat sink 54, the thermally conductive member, and the pluggable electronics module 100 is shown in FIGS. 4A and 4B. The thermally conductive member is a thermal pad 144, which is configured to make contact with a portion of the second area 132 of the top surface 120. The thermal pad 144 can have a variety of shapes and sizes depending on the application. In one embodiment, the thermal pad 144 has a thickness T of 3.5 mm. The thermal pad 144 is constructed of a thermally conductive material, such as a silicone elastomer or a thermally conductive foam. In one embodiment, the thermal pad 144 is constructed of SARCON HRD manufactured by Fujipoly America Corporation of Carteret, N.J. The thermal pad 144 is compressible and provides a force to the first surface 120. The force is a function of the angle θ and the volume of the thermal pad 144. The force is counteracted by the PCB mount rail 42 to maintain the location of the pluggable electronics module 100 in the carrier 34.

A thermal spacer 148 is used in combination with the thermal pad 144 to provide a thermal path from the pluggable electronics module 100 to the heat sink 54. The thermal spacer 148 has a first surface 152 that contacts the underside 56 of the heat sink 54 and a second surface 156 that is manufactured at an angle β, which is approximately equal to the angle θ of the pluggable electronics module 100. The second surface 156 has a groove 160 that has a complimentary shape configured to receive the thermal pad 144. The thermal spacer 148 is constructed of the same material as the heat sink 54 or a different material depending on the desired thermal result.

Figure 5A:
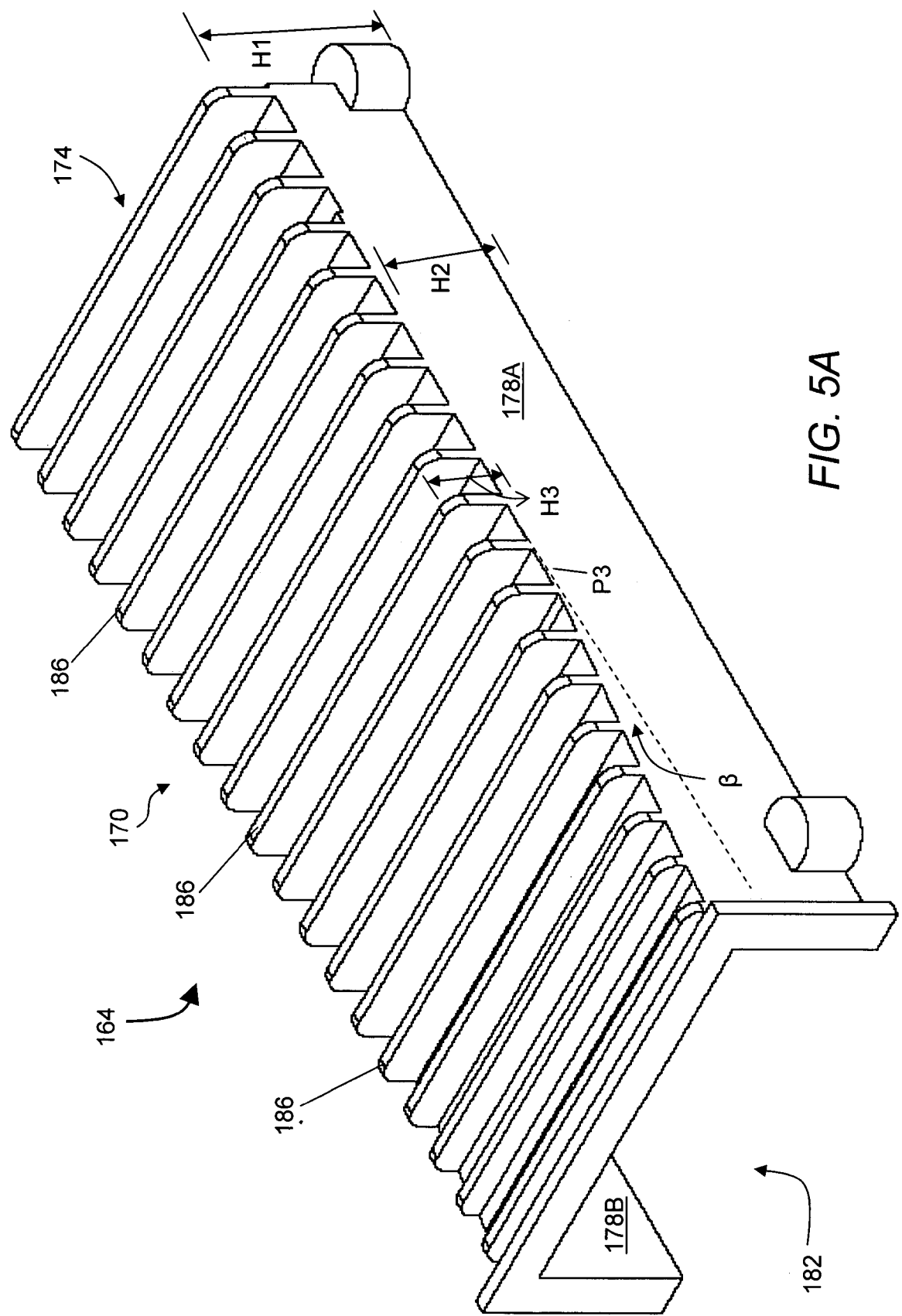
FIG. 5A is an isometric view of an embodiment of a heat sink for use with the module of FIG. 1A.
Figure 5B:
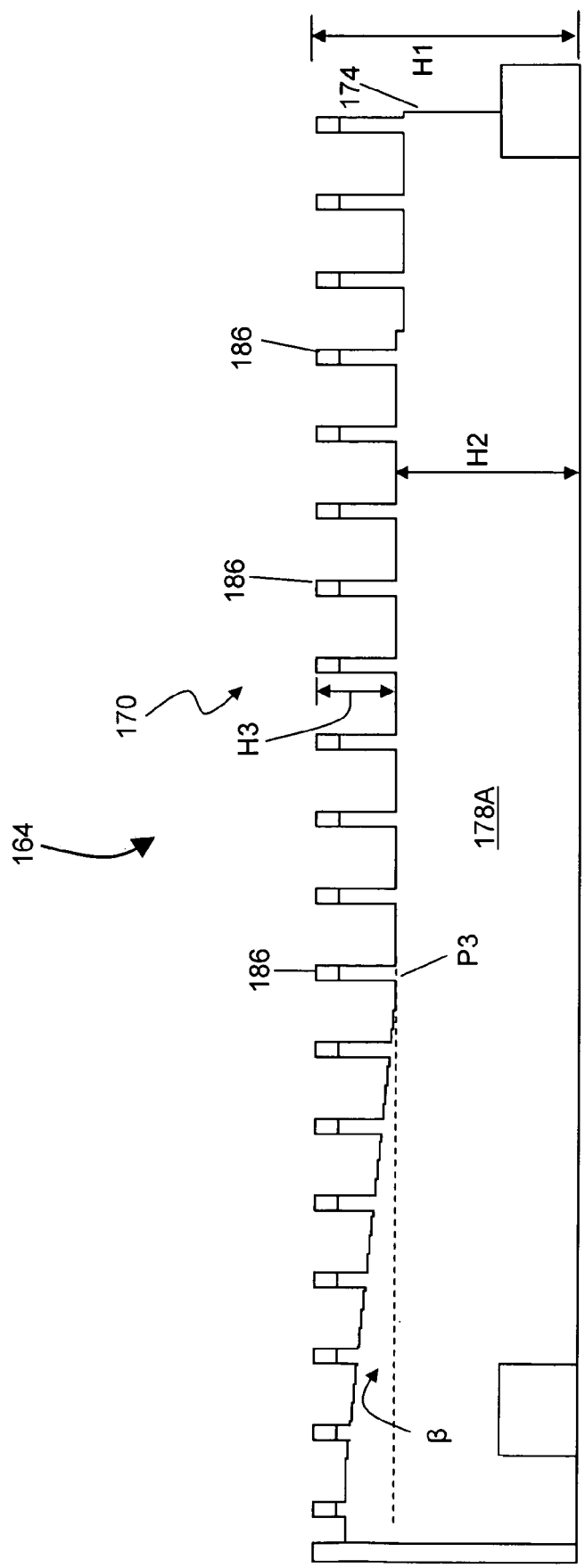
FIG. 5B is a side of the heat sink of FIG. 5B.

FIGS. 5A & 5B show an embodiment of an individual heat sink 164 that is used with the pluggable module 100 in a system when the larger heat sink 55 can not be used. The individual heat sink 164 includes a top panel 170, a back panel 174 and a pair of side panels 178A, 178B. The top panel 170 and the side panels 178A, 178B form a generally C-shaped cross-section. The heat sink 164 also has an opening 182 opposite the back panel 174 that receives the pluggable electronics module 100. Multiple heat transfer fins 186 extend from the top panel 170. The side panels 178A, 178B and the top panel 170 are shaped complementary to the pluggable electronics module 100. The individual heat sink 164 has an overall height H1 that is combination of a height H2 of the side walls 178A, 178B and a height H3 of the heat transfer fins 186. The height H2 of the side panels 178A, 178B changes relative to the distance from the back panel 174. At a predetermined point P3, the height H2 of the side panels 178A, 178B begins to increase according to the angle β, which is complementary to the angle θ of the pluggable electronics module 100. Similarly, at the point P3 the height H3 of the heat transfer fins 186 begins to decrease according to the angle β. The change in the heights H2 and H3 provide minimal separation or no separation between the top surface 120 of the electronics module 100 and the underside of the top panel 170 of the heat sink 164 when the module 100 is fully inserted. A PCB mount rail 42 (not shown) can be included on the inside faces of the side panels 178A, 178B and the back panel 174 to maintain the registration of the module 100 within the individual heat sink 164.

During assembly, an EMC gasket (not shown) is inserted between a PCB 38 and the bottom perimeter of the individual heat sink 164. The EMC gasket and the heat sink 164 create an EMC enclosure for the pluggable module 100. One advantage of this configuration is the conduction of heat generated during the operation of the module 100 into copper planes of the PCB 38. Another advantage is the reduction in the cost of cooling the module 100 and providing EMC shielding for the module. The reduction results from constructing the heat sink 164 of a single die cast part that guides the module 100, seals out noise, and provides a convective heat dissipation surface that contacts the second area 132 of the top module body 104 of the pluggable module 100.

While the invention has been shown and described with reference to specific preferred embodiments, it should be understood by those skilled in the art that various changes in form and detail may be made therein without departing from the spirit and scope of the invention as defined by the following claims. For example, the thermal spacer 148 can be constructed as an integral part of the heat sink 54.

What is claimed is:

1. An electronic system comprising:
an enclosure comprising a heat sink and an opening;
an electronic module inserted into the opening of the enclosure, the electronic module comprising an electronic component and a module body enclosing the electronic component, the module body having a first surface and a second surface, the first surface having a first area approximately parallel to the second surface and having a second area defining a non-zero angle with respect to the first area, wherein a gap exists between the second area and the heat sink; and
a thermal path between the second area and the heat sink.

2. The module of claim 1 wherein the first surface comprises at least one heat transfer fin extending substantially perpendicular therefrom.

3. The module of claim 1 wherein the module body comprises a thermally conductive material.

4. The module of claim 3 wherein the thermally conductive material comprises aluminum.

5. The module of claim 1 further comprising a thermally conductive pad disposed between the first surface and the thermal sink.

6. The apparatus of claim 5 wherein the thermally conductive pad comprises a silicone elastomer.

7. The apparatus of claim 5 wherein the thermally conductive pad comprises a thermally conductive foam.

8. An electronic system according to claim 1, wherein the thermal path comprises a thermal spacer and a thermal pad, the thermal pad in contact with a portion of the second area.

9. An electronic system according to claim 8, wherein the thermal pad comprises a silicone elastomer or a thermally conductive foam.

10. A method of cooling an electronic module comprising:
receiving the electronic module in an opening of a thermal sink, the electronic module having a module body enclosing an electronic component, the module body having a first surface and a second surface, the first surface having a first area approximately parallel to the second surface and having a second area defining a non-zero angle with respect to the first area with a gap existing between the second area and the thermal sink;
providing a thermal path between the second area and the thermal sink; and
dissipating heat generated by the electronic component through the thermal path.

11. The method of claim 10 wherein the providing comprises applying a thermal pad between the second area and the thermal sink.

* * * * *